(12) United States Patent
Hwang et al.

(10) Patent No.: US 10,077,347 B2
(45) Date of Patent: Sep. 18, 2018

(54) BARRIER FILM AND METHOD FOR PREPARING THE SAME

(71) Applicant: LG CHEM, LTD., Seoul (KR)

(72) Inventors: Jang Yeon Hwang, Daejeon (KR); Dong Ryul Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 320 days.

(21) Appl. No.: 14/911,899

(22) PCT Filed: Jan. 19, 2015

(86) PCT No.: PCT/KR2015/000529
§ 371 (c)(1),
(2) Date: Feb. 12, 2016

(87) PCT Pub. No.: WO2015/108384
PCT Pub. Date: Jul. 23, 2015

(65) Prior Publication Data
US 2016/0200886 A1    Jul. 14, 2016

(30) Foreign Application Priority Data

Jan. 17, 2014 (KR) .................. 10-2014-0006133
Aug. 29, 2014 (KR) .................. 10-2014-0114251

(51) Int. Cl.
*C08J 7/06* (2006.01)
*C23C 16/22* (2006.01)
*C23C 14/34* (2006.01)
*C09D 1/00* (2006.01)
*C09D 7/63* (2018.01)

(52) U.S. Cl.
CPC ............ *C08J 7/065* (2013.01); *C09D 1/00* (2013.01); *C09D 7/63* (2018.01); *C23C 14/34* (2013.01); *C23C 16/22* (2013.01); *C08J 2369/00* (2013.01)

(58) Field of Classification Search
USPC .......................................... 427/162; 428/216
See application file for complete search history.

(56) References Cited

U.S. PATENT DOCUMENTS

2008/0226924 A1* 9/2008 Okubo .................. B32B 7/02
                                                          428/426
2010/0019664 A1* 1/2010 Mishima ............ H01L 51/5268
                                                          313/504
(Continued)

FOREIGN PATENT DOCUMENTS

CN           1510723        7/2004
CN       102380978 A        3/2012
(Continued)

OTHER PUBLICATIONS

Machine_English_translation_KR_20130091281_A1; Ryu, Sang Uk; Gas Barrier Film and the Method for Preparing the Same; Aug. 16, 2013; EPO; whole document.*

*Primary Examiner* — Tahseen Khan
(74) *Attorney, Agent, or Firm* — Dentons US LLP

(57) ABSTRACT

Provided are a barrier film and a method for preparing the same. Particularly, the barrier film is applied to an organic or inorganic phosphor, a display, or a photovoltaic device to effective block chemical materials such as water or oxygen, protect an electronic device therein, and maintain excellent optical characteristics.

17 Claims, 1 Drawing Sheet

(56) References Cited

U.S. PATENT DOCUMENTS

| | | | |
|---|---|---|---|
| 2010/0090201 A1* | 4/2010 | Liu | C08F 220/44 257/40 |
| 2014/0166105 A1* | 6/2014 | Kawakami | B32B 7/02 136/256 |
| 2014/0199544 A1* | 7/2014 | Naganawa | C08J 7/047 428/336 |

FOREIGN PATENT DOCUMENTS

| | | |
|---|---|---|
| CN | 103221485 A | 7/2013 |
| EP | 1787796 B1 | 2/2013 |
| JP | 2002-264274 A | 9/2002 |
| JP | 2013-67109 A | 4/2013 |
| JP | 2013-67146 A | 4/2013 |
| JP | 2013071258 | 4/2013 |
| JP | 2013208844 | 10/2013 |
| KR | 10-2012-0077643 A | 7/2012 |
| KR | 10-2013-0091281 A | 8/2013 |
| KR | 20130091281 A1 * | 8/2013 |
| WO | WO2013047522 A1 * | 4/2013 |

\* cited by examiner

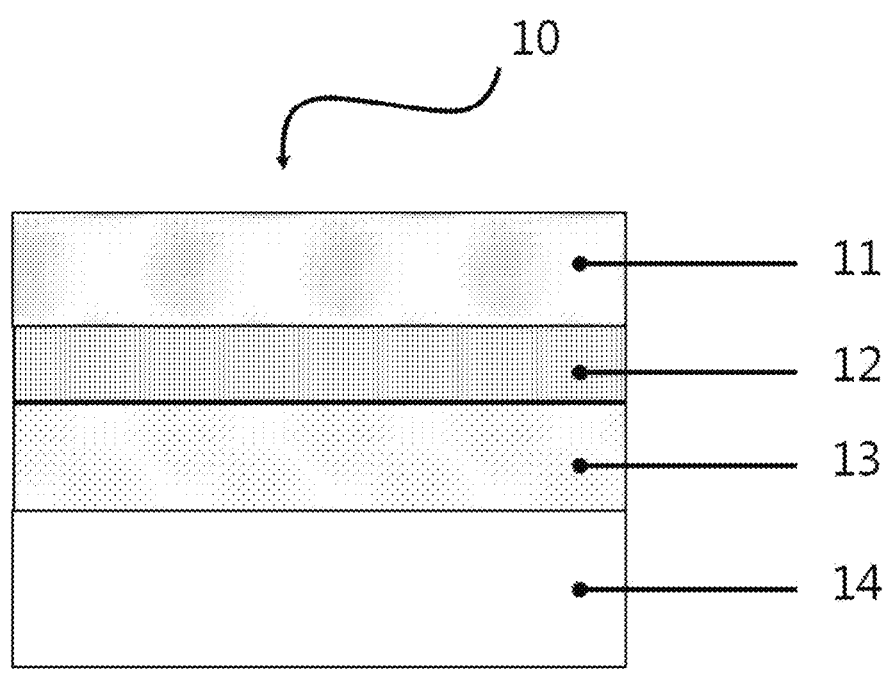

BARRIER FILM AND METHOD FOR PREPARING THE SAME

This application is a National Stage Entry of International Application No. PCT/KR2015/000529, filed Jan. 19, 2015, and claims the benefit of and priority to Korean Application No. 10-2014-0006133, filed Jan. 17, 2014 and Korean Application No. 10-2014-0114251, filed Aug. 29, 2014, all of which are incorporated herein by reference in their entirety for all purposes as if fully set forth herein.

TECHNICAL FIELD

The present application relates to a barrier film and a method for preparing the same.

BACKGROUND ART

When electric devices and metal interconnections included in organic or inorganic phosphors, displays, and photovoltaic devices, etc. are in contact with external chemical substances such as oxygen or water, they are modified or oxidized, and thus cannot be properly functioning. Accordingly, it is necessary to protect the electric devices from the chemical materials. To this end, a technique of protecting internal electric devices vulnerable to the chemical substances using a glass plate as a substrate or a cover plate has been proposed. The glass plate has satisfactory characteristics including light transmittance, coefficient of thermal expansion, and chemical resistance. However, since glass is heavy, hard, and easily breakable, it should be carefully handled.

Accordingly, there are active attempts to replace the glass plate used as a substrate for an electric device with a plastic film or sheet, which is a representative material having a lighter weight, superior impact resistance, and higher flexibility, compared with the glass plate. However, it is necessary to complement deficient physical properties of a plastic film commercially produced these days, compared with the glass plate. Particularly, it is most urgently necessary to improve water resistance and gas barrier properties among the physical properties of the plastic film, compared with the characteristics of the glass plate, and a barrier film showing excellence both in gas barrier properties and light transmittance is required.

PRIOR ART DOCUMENT

1. Japanese Laid-Open Patent Application No. 2007-090803

DISCLOSURE

Technical Problems

The present application is directed to providing a barrier film applicable to an organic or inorganic phosphor device, a display device or a photovoltaic device to effectively block environmental chemical materials such as moisture or oxygen, protect an electronic device therein, and maintain excellent optical characteristics, and a method of manufacturing the same.

Technical Solution

In one aspect, the present application provides a barrier film. In one example, the barrier film of the present application may be applied to organic or inorganic phosphor devices, display devices, or photovoltaic device. The exemplary barrier film 10, as shown in FIG. 1, may sequentially include a base layer 14, a first dielectric layer 13, an inorganic layer 12, and a second dielectric layer 11, and satisfy General Formula 1. Here, the inorganic layer may have a refractive index of 1.65 or more. In addition, the first dielectric layer may have a thickness of 100 nm or more, and a thickness of the second dielectric layer may be equal to or less than that of the first dielectric layer. That is, the thickness of the second dielectric layer may be equal to or smaller than that of the first dielectric layer. Meanwhile, the refractive index of the inorganic layer may be at least 1.65, for example, 1.7 or more, 1.75 or more, 1.8 or more, 1.85 or more, 1.9 or more, 1.95 or more, 1.96 or more, 1.97 or more, 1.98 or more, 1.99 or more, or 2.0 or more. The upper limit of the refractive index of the inorganic layer may be, but is not particularly limited to, for example, 3.0 or less, 2.5 or less, 2.4 or less, 2.3 or less, or 2.2 or less. The present application may provide a barrier film having gas barrier properties and excellent optical characteristics by controlling the thicknesses and refractive indices of the first dielectric layer and the second dielectric layer in addition to the inorganic layer having a relatively high refractive index.

$$n_2 \leq n_1 < n_i \qquad \text{[General Formula 1]}$$

In General Formula 1, $n_1$ represents the refractive index of the first dielectric layer, $n_2$ represents the refractive index of the second dielectric layer, and $n_i$ represents the refractive index of the inorganic layer.

Optical characteristics of the film having a structure in which several layers are laminated are effected by adjusting the refractive indices and thicknesses of the component layers. Particularly, since reflection and refraction of light occur at the interface of two layers having different refractive indices, the laminated materials, which give rise to the difference in refractive index among themselves, and the lamination sequence have profound effects on the optical characteristics of the multilayer film. The first dielectric layer, the inorganic layer and the second dielectric layer may be formed of materials known to those of ordinary skill in the art without limitation as long as the materials satisfy the relationship of the refractive indices, and as the relationship of the refractive indices and the thickness relationship are satisfied, the barrier film having excellent optical characteristics may be manufactured.

The term "refractive index" used herein may be, unless particularly defined, a refractive index in the range of a wavelength from 300 to 1000 nm. In one example, the "refractive index" used herein may refer to a refractive index in a wavelength of 550 or 633 nm.

In addition, the barrier film of the present application having excellent optical characteristics may be manufactured by satisfying the thickness relationship according to General Formula 4.

$$0.01 \leq d_2/d_1 \leq 1 \qquad \text{[General Formula 4]}$$

In General Formula 4, $d_1$ is a thickness of the first dielectric layer, and $d_2$ is a thickness of the second dielectric layer.

As described above, the ratio of the thickness of the second dielectric layer $d_2$ to the thickness of the first dielectric layer $d_1$ may be 0.01 to 1, or 0.01 or more and less than 1, for example, 0.02 to 1.0, 0.05 to 1.0, 0.1 to 1.0, 0.1 to 0.9, 0.1 to 0.8, or 0.1 to 0.7. As described above, as the ratio of the thickness between the first dielectric layer and the second dielectric layer is limited to a specific range, a film having excellent gas barrier properties and light transmittance may be manufactured.

In one example, the thickness of the first dielectric layer $d_1$ may be 100 nm or more, for example, more than 100 nm and 2 μm or less. In addition, the thickness of the first dielectric layer $d_1$ may be 110 to 1 μm, 120 to 900 nm, 130 to 800 nm, 140 to 700 nm, 150 to 600 nm, 150 to 500 nm, or 150 to 480 nm. In one example, the thickness of the second dielectric layer $d_2$ may be 10 nm to 1 μm, 10 to 900 nm, 20 to 800 nm, 30 to 700 nm, 35 to 600 nm, 40 to 500 nm, or 45 to 480 nm.

In addition, in an exemplary embodiment of the present application, the refractive index $n_1$ of the first dielectric layer and the refractive index $n_2$ of the second dielectric layer may satisfy General Formula 2.

$$0.5 \leq (n_2-1)/(n_1-1) \leq 1 \qquad \text{[General Formula 2]}$$

As shown in General Formula 2, the ratio $(n_2-1)/(n_1-1)$ of the refractive index of the second dielectric layer $n_2$ to the refractive index of the first dielectric layer $n_1$ may be 0.5 to 1, preferably, 0.55 to 1, 0.6 to 1, 0.65 to 1, or 0.7 to 1.

In addition, in an exemplary embodiment of the present application, the refractive index of the first dielectric layer $n_1$ and the refractive index of the inorganic layer $n_i$ may satisfy General Formula 3.

$$0.3 \leq (n_1-1)/(n_i-1) \leq 0.95 \qquad \text{[General Formula 3]}$$

As shown in General Formula 3, the ratio $(n_1-1)/(n_i-1)$ of the refractive index of the first dielectric layer $n_1$ to the refractive index of the inorganic layer $n_i$ may be 0.3 to 0.95, preferably 0.35 to 0.85, 0.4 to 0.8, 0.4 to 0.75, 0.4 to 0.7, or 0.45 to 0.7.

According to the present application, a film having excellent light transmittance may be manufactured by limiting the ratio of a refractive indices between the first dielectric layer and the second dielectric layer and/or the ratio of the refractive indices between the inorganic layer and the second dielectric layer in a specific range.

In one example, a refractive index of the base layer may be, but is not particularly limited to, 1.45 to 1.75, 1.45 to 1.7, or 1.5 to 1.65. As long as satisfying General Formula 1, the refractive index of the first dielectric layer $n_1$ or the refractive index of the second dielectric layer $n_2$ may be, but is not particularly limited to, 1.35 to 1.9, 1.4 to 1.9, 1.45 to 1.9, or 1.45 to 1.8.

In addition, when the refractive index of the base layer is $n_s$, the refractive index of the base layer may be lower than the refractive index of the inorganic layer $n_i$. In one example, the refractive index of the base layer $n_s$ and the refractive index of the inorganic layer $n_i$ may satisfy General Formula 5.

$$n_s < n_i \qquad \text{[General Formula 5]}$$

In the present application, the refractive index of the base layer $n_s$ and the refractive index of the first dielectric layer $n_1$ may also satisfy General Formula 6.

$$0.5 \leq n_s/n_1 \leq 1.5 \qquad \text{[General Formula 6]}$$

That is, the material for the base layer of the present application is not particularly limited, but may satisfy General Formula 5 or 6. For example, the ratio $(n_s/n_1)$ of the refractive index of the base layer $n_s$ to the refractive index of the first dielectric layer $n_1$ may be 0.5 to 1.5, and specifically, 0.6 to 1.4 or 0.7 to 1.3.

The relationship between the thickness of the first dielectric layer and that of the second dielectric layer of the barrier film according to the present application may be suitably controlled according to the material characteristics and relationship of the refractive indices of the layers, and characteristics of the inorganic layer of the barrier film, and satisfy General Formula 4. For example, as the thickness relationship is satisfied, excellent gas barrier properties, and light transmittance may be realized with a zinc oxide-based inorganic layer that is described below.

The barrier film may also have excellent light transmittance in the visible region. In one exemplary embodiment, the present application may exhibit light transmittance of 88% or more in the wavelength range of 380 to 780 nm. In the present application, the barrier film sequentially including the base layer, the first dielectric layer, the inorganic layer, and the second dielectric layer may maintain excellent transparency. For example, the barrier film formed by satisfying the specific relationship of the refractive indices among the layers or the relationship of the thickness ratio may have light transmittance of 88% or more, 89% or more, or 90% or more in the range of a wavelength from 380 to 780 nm.

In addition, the barrier film may exhibit a lower yellowness index and excellent light transmittance. In one example, when the specific relationship of the refractive indices among the layers or the relationship of the thickness ratio is satisfied, the barrier film having a lower yellowness index may be provided. For example, the yellowness index according to ASTM E313 may be −2.0 to 2.0, −1.8 to 1.8, −1.5 to 1.9, −1.4 to 1.8, or −1.4 to 1.7.

In addition, the barrier film may have a b* value of the CIE coordinate system in a range of −1.0 to 1.5 or −0.8 to 1.2. The CIE coordinate system is a color value defined in the Commission Internationale de l'Eclairage (CIE), and referred to as the CIE colorimetric system or the CIE color space. The coordinate system is a uniform color space coordinate, and a coordinate system today standardized in the world because it has very minute difference from the color recognition of human eyes. The CIE coordinate system is defined by L* denoting brightness and a* and b* denoting chromaticity, and the a* and b* represent directions of the color.

Particularly, when the a* value is a positive number, it represents the red direction, when the a* value is a negative number, it represents the green direction, when the b* value is a positive number, it represents the yellow direction, and when the b* value is a negative number, it represents the blue direction. The b* value of a barrier film may be evaluated by a known method.

In an exemplary embodiment of the present application, the first dielectric layer, the inorganic layer and the second dielectric layer may use a variety of materials which can be known by those of ordinary skill in the art may be used without limitation as long as the relationship of the refractive indices and the thickness relationship are satisfied.

In one example, the base layer may include at least one selected from the group consisting of a polyester-based resin such as polyethyleneterephthalate, polycarbonate, polyethylenenaphthalate, or polyarylate, a polyether-based resin such as polyethersulfone, a polyolefin-based resin such as a cyclo-olefin polymer, a polyethylene resin, or a polypropylene resin, a cellulose-based resin such as diacetylcellullose, triacetylcellullose, or acetylcellullosebutylate, a polyimide-based resin, and an epoxy-based resin. In the present application, the base layer may include polycarbonate or a cyclo-olefin polymer. In one example, the thickness of the base layer may be, but is not particularly limited to, 2 to 200 μm, preferably, 5 to 190 μm, 10 to 180 μm, 20 to 180 μm, or 20 to 150 µm. In addition, the base layer may include a separate coating layer laminated on the opposite surface of the above-described multilayer laminate. The coating layer may be laminated to a thickness of 0.01 to 10 µm to improve optical characteristics, complement mechanical properties, or give functionality to make henceforth processes easy.

In one example, the inorganic layer may be one or more of oxides or nitrides of at least one metal selected from the group consisting of Al, Zr, Ti, Hf, Ta, In, Sn, Zn, and Si. The thickness of the inorganic layer may be 5 to 100 nm, 10 to 90 nm or 10 to 80 nm. In one example, the inorganic layer of the present application may be formed of a zinc oxide-based material. The zinc oxide-based inorganic layer may be a zinc oxide-based material not containing any dopant, or a zinc oxide-based material containing dopants. The dopant which can be doped to the zinc oxide may be, but not limited to, at least one element selected from the group consisting of Ga, Si, Ge, Al, Sn, Ge, B, In, Tl, Sc, V, Cr, Mn, Fe, Co, and Ni, or an oxide thereof. The dopant may be doped to zinc oxide (ZnO) in the type of a cation, and which substitutes a Zn moiety and increases the concentration of electrons or holes of the zinc oxide-based inorganic layer. However, not to degrade electron mobility, the concentration of the dopant may be 0.1 to 20 wt %. Alternatively, when mechanical properties and optical characteristics are adjusted using a dopant, the concentration of the dopant may be increased at 15 to 85 at %. In an exemplary embodiment of the present application, the inorganic layer may be laminated without any limitation as long as it satisfies the proper refractive index and, for example zinc tin oxide can be used for it. As the zinc tin oxide is applied as the inorganic layer to the barrier film satisfying the above-described relation of the refractive indices and the thickness relationship, the barrier film may exhibit excellent gas barrier properties and optical characteristics.

In an exemplary embodiment of the present application, the first dielectric layer or the second dielectric layer may be an organic or organic-inorganic composite layer. In one example, the first dielectric layer or the second dielectric layer may include at least one selected from the group consisting of an acryl-based resin, a urethane-based resin, a melamine resin, an alkyde resin, an epoxy-based resin, a siloxane-based polymer, and an organic silane compound represented by Formula 1.

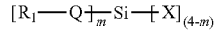

[Formula 1]

In Formula 1, X may be hydrogen, a halogen, an alkoxy group, an acyloxy group, an alkylcarbonyl group, an alkylcarbonyl group or —N(R$_2$)$_2$, in which R$_2$ is hydrogen or an alkyl group, R$_1$ is an alkyl group, an alkenyl group, an alkynyl group, an aryl group, an arylalkyl group, an alkylaryl group, an arylalkenyl group, an alkenylaryl group, an arylalkynyl group, an alkynylaryl group, a halogen, an amino group, an amide group, an aldehyde group, an alkylcarbonyl group, a carboxyl group, a mercapto group, a cyano group, a hydroxyl group, an alkoxy group, an alkoxycarbonyl group, a sulfonyl group, a phosphoryl group, an acryloyloxy group, a methacryloyloxy group or an epoxy group, Q is a single bond, an oxygen atom or —N(R$_2$)—, in which R$_2$ is a hydrogen atom or an alkyl group, and m is a number between 1 to 3.

The organic silane may be at least one selected from the group consisting of the compound represented by Formula 1, and when a type of organic silane compound is used, crosslinking can occur.

An example of the organic silane may be selected from the group consisting of methyltrimethoxysilane, methyltriethoxysilane, phenyltrimethoxysilane, phenyltriethoxysilane, dimethyldimethoxysilane, dimethyldiethoxysilane, diphenyldimethoxysilane, diphenyldiethoxysilane, phenyldimethoxysilane, phenyldiethoxysilane, methyldimethoxysilane, methyldiethoxysilane, phenylmethyldimethoxysilane, phenylmethyldiethoxysilane, trimethylmethoxysilane, trimethylethoxysilane, triphenylmethoxysilane, triphenylethoxysilane, phenyldimethylmethoxysilane, phenyldimethylethoxysilane, diphenylmethylmethoxysilane, diphenylmethylethoxysilane, dimethylmethoxysilane, dimethylethoxysilane, diphenylmethoxysilane, diphenylethoxysilane, 3-aminopropyltriethoxysilane, 3-glycidoxypropyltrimethoxysilane, p-aminophenylsilane, allyltrimethoxysilane, n-(2-aminoethyl)-3-aminopropyltrimethoxysilane, 3-aminopropyltriethoxysilane, 3-aminopropyltrimethoxysilane, 3-glycidoxypropyldiisopropylethoxysilane, (3-glycidoxypropyl)methyldiethoxysilane, 3-glycidoxypropyltrimethoxysilane, 3-mercaptopropyltrimethoxysilane, 3-mercaptopropyltriethoxysilane, 3-methacryloxypropylmethyldiethoxysilane, 3-methacryloxypropylmethyldimethoxysilane, 3-methacryloxypropyltrimethoxysilane, n-phenylaminopropyltrimethoxysilane, vinylmethyldiethoxysilane, vinyltriethoxysilane, vinyltrimethoxysilane, and a mixture thereof.

In one example, the first dielectric layer or the second dielectric layer may further include at least one selected from the group consisting of pentaerythritol triacrylate, hydroxyethylacrylate, hydroxypropylacrylate, polyethyleneglycol monoacrylate, ethyleneglycol monoacrylate, hydroxybutylacrylate, glycidoxymethacrylate, propyleneglycol monoacrylate, trimethoxysilylethyl epoxycyclohexane, acrylic acid, and methacrylic acid.

In one example, the epoxy-based resin may be at least one selected from the group consisting of an alicyclic epoxy resin and an aromatic epoxy resin.

The alicyclic epoxy resin may be, for example, at least one selected from the group consisting of an alicyclic glycidyl ether-type epoxy resin and an alicyclic glycidyl ester-type epoxy resin. In addition, as an example, Celloxide 2021P (Daicel), that is, 3,4-epoxycyclohexyl-methyl-3,4-epoxycyclohexane carboxylate, and derivatives thereof may be used, which may be stable at a high temperature, colorless and clear, and have excellent toughness, adhesion and adhesive strength for a laminate. Particularly, when the alicyclic epoxy resin is used for coating, excellent surface hardness is exhibited.

The aromatic epoxy resin may be at least one aromatic epoxy resin selected from the group consisting of a bisphenol A-type epoxy resin, a bromobisphenol A-type epoxy resin, a bisphenol F-type epoxy resin, a bisphenol AD-type epoxy resin, a fluorene-containing epoxy resin, and a triglycidyl isocyanurate.

An inorganic material for forming the first dielectric layer or the second dielectric layer may be a coating composition formed by a sol-gel reaction, for example, at least one selected from the group consisting of SiO$_x$ (wherein x is an integer of 1 to 4), SiO$_x$N$_y$ (wherein x and y are each an integer of 1 to 3), Al$_2$O$_3$, TiO$_2$, ZrO, and ITO.

In addition, the first dielectric layer or the second dielectric layer may further include at least one selected from the group consisting of metal alkoxide compounds represented by Formula 2.

[Formula 2]

In Formula 2, M is any one metal selected from the group consisting of aluminum, zirconium, and titanium, $R_3$ is a halogen, an alkyl group, an alkoxy group, an acyloxy group, or a hydroxyl group, and z is 3 or 4.

In an exemplary embodiment of the present application, the first dielectric layer or the second dielectric layer may further include filler of nanoparticles to adjust the refractive index. The filler may be, but is not limited to, a metal oxide or a metal nitride. In one example, the filler may include at least one selected from the group consisting of CaO, $CaF_2$, MgO, $ZrO_2$, $TiO_2$, $SiO_2$, $In_2O_3$, $SnO_2$, $CeO_2$, BaO, $Ga_2O_3$, ZnO, $Sb_2O_3$, NiO, and $Al_2O_3$. In addition, in one example, when the filler is used in coating for a dielectric layer, a surface of the filler may be treated as needed to improve an adhesive strength. For example, the surface of the filler may be treated with epoxy silane, acryl silane, or vinyl silane. The filler may have a diameter of 0.1 to 150 nm, 0.1 to 100 nm, 1 to 90 nm, 1 to 70 nm, or 1 to 50 nm. As the size of the filler is controlled in the above range, transparency and a desired refractive index of the film of the present application may be satisfied.

The first dielectric layer or the second dielectric layer may be cured by utilizing thermal curing, photocuring, or a combination thereof, and may further include a thermal acid generator or a photo acid generator as needed.

When the curing is performed with heat, thermal resistance of the base layer should be considered, and an amorphous base layer may be cured at its glass transition temperature or less, and if having crystallinity, the curing may be used at a higher temperature than the glass transition temperature. For example, a cyclo-olefin copolymer (COP) may be cured at 120° C. or less, polycarbonate (PC) may be cured at 130° C. or less, poly(ethylene terephthalate) (PET) may be cured at 130° C. or less, and polyethylenenaphthalate (PEN) may be cured at 150° C. or less.

The present application also relates to a method of manufacturing the above-described barrier film. The exemplary manufacturing method may include sequentially laminating a first dielectric layer, an inorganic layer having a refractive index of 1.65 or more and a second dielectric layer on a base layer. In addition, the first dielectric layer, the inorganic layer and the second dielectric layer may satisfy General Formula 1, the thickness of the first dielectric layer may be 100 nm or more than 100 nm and the thickness of the second dielectric layer may be equal to or lower than the thickness of the first dielectric layer.

$$n_2 \leq n_1 < n_i \quad \text{[General Formula 1]}$$

In General Formula 1, $n_1$ is the refractive index of the first dielectric layer, $n_2$ is the refractive index of the second dielectric layer, and $n_i$ is the refractive index of the inorganic layer.

To sequentially form the first dielectric layer, the inorganic layer and the second dielectric layer on the base layer, vacuum evaporation, sputtering, atomic layer deposition, ion plating, or coating may be used, but the present application is not limited thereto, and thus a common method known to the art may be used.

Advantageous Effects

A barrier film according to the present application can be applied to an organic or inorganic phosphor device, a display device, or a photovoltaic device to effectively block chemical substances such as water or oxygen, protect an electronic device therein, and maintain excellent optical characteristics.

DESCRIPTION OF DRAWINGS

FIG. 1 is a diagram of an exemplary barrier film according to the present application.

DESCRIPTIONS OF REFERENCE NUMERALS

10: barrier film
11: second dielectric layer
12: inorganic layer
13: first dielectric layer
14: base layer

MODE FOR INVENTION

Hereinafter, the present application will be described in further detail with reference to examples according to the present application and comparative examples not according to the present application, but the scope of the present application is not limited to the following examples.

Example 1

A first dielectric layer having a refractive index of 1.48 was formed to a thickness of 0.26 μm on a polycarbonate (PC) film (thickness: 100 μm, refractive index: 1.61) using a coating solution prepared of pentaerythritol triacrylate and methylethoxy silane in the weight ratio of 40:60. Specifically, a half of the total weight of the pentaerythritol triacrylate used in the coating solution was a reaction product with isocyanato trietoxysilane. The coating solution was prepared by hydrating a mixture of the pentaerythritol triacrylate and methoxy silane using 2 equivalent of water based on silanol and 1.5 parts by weight of 0.1 N hydrochloric acid based on the solid content at room temperature for 30 hours. A first dielectric layer was formed by coating the PC film with the coating solution using a meyer bar, drying the coated film at room temperature for 3 minutes, and drying the coated result at 100° C. for 1 minute. Zinc tin oxide layer having a refractive index of 2.0 was laminated on the coated film as the inorganic layer to a thickness of approximately 20 nm by sputtering in a 3 mTorr argon atmosphere. A second dielectric layer was formed on the deposited layer to a thickness of 0.1 μm using the coating solution used to form the first dielectric layer, and thus a barrier film was manufactured.

Comparative Example 1

A barrier film was manufactured by the same method as described in Example 1, except that the first dielectric layer was formed to a thickness of 0.1 μm, and the second dielectric layer was formed to a thickness of 0.26 μm.

Example 2

A first dielectric layer having a refractive index of 1.65 was formed to a thickness of 0.26 μm on a PC film (thickness: 100 μm, refractive index: 1.61) using a coating solution (TYT65, Toyo Ink Co., Ltd.) including metal oxide nanoparticles (titanium dioxide) in an acryl resin. A coated layer was formed by coating the PC film with a coating solution using a meyer bar, drying the coated film at room temperature for approximately 2 minutes, and curing the dried result by irradiation with a UV ray for coating at an intensity of 0.5 J/cm². Zinc tin oxide layer having a refractive index of 2.0 was laminated on the coated film as an inorganic layer to a thickness of approximately 20 nm by sputtering in a 3 mTorr argon atmosphere. A second dielectric layer having a refractive index of 1.48 was formed on the deposited layer to a thickness of 0.1 μm using the coating solution used in Example 1, and thus a barrier film was manufactured.

Comparative Example 2

A barrier film was manufactured by the same method as described in Example 2, except that a dielectric layer (thickness: 260 nm) having a refractive index of 1.48 was formed as the first dielectric layer using a coating solution prepared of pentaerythritol triacrylate and methylethoxy silane in a weight ratio of 40:60, and a dielectric layer (thickness: 100 nm) having a refractive index of 1.65 was formed as the second dielectric layer using a coating solution (TYT65, Toyo Ink Co., Ltd.) including metal oxide nanoparticles in an acryl resin.

Comparative Example 3

A barrier film was manufactured by the same method as described in Example 2, except that the second dielectric layer was not formed.

Example 3

A first dielectric layer having a refractive index of 1.48 was formed on a cyclo olefin copolymer COP film (thickness: 50 μm, refractive index: 1.53) as a base layer film to a thickness of 220 nm using the coating solution according to Example 1. Zinc tin oxide layer having a refractive index of 2.0 was laminated on the coated film as the inorganic layer to a thickness of approximately 20 nm by sputtering in a 3 mTorr argon atmosphere. A second dielectric layer having a refractive index of 1.48 was formed on the deposited layer to a thickness of 90 nm using the coating solution used in Example 1, and thus a barrier film was manufactured.

Comparative Example 4

A barrier film was manufactured by the same method as described in Example 3, except that the first dielectric layer was formed to a thickness of 0.1 μm, and the second dielectric layer was formed to a thickness of 0.32 μm.

Comparative Example 5

A first dielectric layer having a refractive index of 1.65 was formed on a PC film (thickness: 100 μm, refractive index: 1.61) to a thickness of 91 nm using a coating solution (TYT65, Toyo Ink, Co., Ltd.) including metal oxide nanoparticles in an acryl resin. Zinc tin oxide having a refractive index of 2.0 was laminated on the coated film as an inorganic layer to a thickness of 20 nm by sputtering in a 3 mTorr argon atmosphere. A second dielectric layer having a refractive index of 1.48 was formed on the deposited layer to a thickness of 40 nm using a coating solution prepared of pentaerythritol triacrylate and methylethoxy silane in a weight ratio of 40:60, and thus a barrier film was manufactured.

Comparative Example 6

A first dielectric layer having a refractive index of 1.60 was formed on a COP film (thickness: 50 μm, refractive index: 1.53) to a thickness of 0.15 μm using a coating solution (TYT60, Toyo Ink, Co., Ltd.) including metal oxide nanoparticles in an acryl resin. Silicon oxynitride was laminated on the coated first dielectric layer to a thickness of approximately 50 nm by adding argon, oxygen and nitrogen in a volume ratio of 40:3.3:15, and applying 2 kW RF power to a silicon target (refractive index of the inorganic layer=1.6). A second dielectric layer having a refractive index of 1.48 was formed on the deposited layer to a thickness of 70 nm using the coating solution of Example 1, and thus a barrier film was manufactured.

Example 4

A barrier film was manufactured by the same method as described in Example 3, except that the first dielectric layer was formed to a thickness of 0.48 μm, and the second dielectric layer was formed to a thickness of 0.43 μm.

1. Measurement of Refractive Index and Thickness

Refractive indices and thicknesses of the first dielectric layers, the second dielectric layers, and the inorganic layers according to Examples and Comparative Examples of the present application were measured by the following methods.

Samples for measuring a refractive index were prepared by forming a dielectric layer or an inorganic layer on a Si substrate. The refractive index of the sample was obtained by analysis using an ellipsometer (M2000U, J.A. Woolam Co.).

The thicknesses of layers coated on a base layer were measured using a scanning electron microscope (S4800, Hitachi).

2. Measurement of Average Light Transmittance

Optical transmission spectrums of the barrier films manufactured according to Examples and Comparative Examples were evaluated using Shimadzu UV3600 (average light transmittance from 380 to 780 nm).

3. Measurement of Water Vapor Transmission Rate (WVTR)

WVTRs of the barrier films manufactured according to Examples and Comparative Examples were evaluated using Lyssy L80 at 30° C. and 100% R.H.

4. Measurement of Yellowness Index and CIE Value

Yellowness index (according to ASTM E313) and a* and b* values in the CIE color coordinates of the barrier films manufactured according to Examples and Comparative Examples were obtained From a light transmission spectrum using a utility provided by Shimadzu.

TABLE 1

| | Average light transmittance (%) | a* | b* | Yellowness index | WVTR (g/m² day) |
|---|---|---|---|---|---|
| Example 1 | 90.3 | −0.1 | −0.3 | −0.6 | <0.03 |
| Example 2 | 91.2 | −0.6 | 1.1 | 1.6 | <0.03 |
| Example 3 | 90.6 | −0.3 | −0.6 | −1.4 | <0.03 |
| Example 4 | 90.1 | −1.1 | 0.0 | −0.9 | <0.03 |
| Comparative Example 1 | 86.6 | −0.6 | −2.5 | −5.5 | <0.03 |
| Comparative Example 2 | 88 | −1.2 | 0.9 | −2.6 | <0.03 |
| Comparative Example 3 | 84.7 | −0.5 | 2.5 | 4.4 | <0.03 |
| Comparative Example 4 | 88.4 | −2.5 | 7.4 | 12 | <0.03 |
| Comparative Example 5 | 85.7 | −0.1 | 1.3 | 2.5 | <0.03 |
| Comparative Example 6 | 92.0 | 0.0 | 1.5 | 2.8 | <0.03 |

The invention claimed is:

1. A barrier film, sequentially comprising:
a base layer, a first dielectric layer, an inorganic layer having a refractive index of 1.65 or more, and a second dielectric layer,
wherein the first dielectric layer has a thickness of 100 nm or more, a thickness of the second dielectric layer is equal to or lower than that of the first dielectric layer, and
wherein yellowness index according to ASTM E313 is −2.0 to 2.0, and
wherein the barrier film satisfies General Formula 1 and General Formula 4:

$$n_2 \leq n_1 < n_i$$ [General Formula 1]

$$0.01 \leq d_2/d_1 \leq 1$$ [General Formula 4]

wherein $n_1$ represents a refractive index of the first dielectric layer, $n_2$ represents a refractive index of the second dielectric layer, and $n_i$ represents the refractive index of the inorganic layer, $d_1$ represents the thickness of the first dielectric layer, and $d_2$ represents the thickness of the second dielectric layer.

2. The barrier film according to claim 1, wherein the thickness of the second dielectric layer $d_2$ is 10 nm to 1 μm.

3. The barrier film according to claim 1, wherein the refractive index of the first dielectric layer $n_1$ and the refractive index of the second dielectric layer $n_2$ satisfy General Formula 2:

$$0.5 \leq (n_2-1)/(n_1-1) \leq 1$$ [General Formula 2].

4. The barrier film according to claim 1, wherein the refractive index of the first dielectric layer $n_1$ and the refractive index of the inorganic layer $n_i$ satisfy General Formula 3:

$$0.3 \leq (n_1-1)/(n_i-1) \leq 0.95.$$ [General Formula 3].

5. The barrier film according to claim 1, wherein a refractive index of the base layer is 1.45 to 1.75.

6. The barrier film according to claim 1, wherein the refractive index of the base layer $n_s$ and the refractive index of the inorganic layer $n_i$ satisfy General Formula 5:

$$n_s < n_i.$$ [General Formula 5].

7. The barrier film according to claim 1, wherein a refractive index of the base layer $n_s$ and a refractive index of the first dielectric layer $n_i$ satisfy General Formula 6:

$$0.5 \leq n_s/n_1 \leq 1.5$$ [General Formula 6].

8. The barrier film according to claim 1, wherein a refractive index of the first dielectric layer $n_1$ or a refractive index of the second dielectric layer $n_2$ is 1.35 to 1.9.

9. The barrier film according to claim 1, wherein the inorganic layer comprises an oxide or nitride of at least one metal selected from the group consisting of Al, Zr, Ti, Hf, Ta, In, Sn, Zn and Si.

10. The barrier film according to claim 1, wherein the inorganic layer is formed of zinc tin oxide.

11. A method for preparing the barrier film according to claim 1, comprising:
sequentially laminating on a base layer a first dielectric layer, an inorganic layer having a refractive index of 1.65 or more, and a second dielectric layer, which satisfy General Formula 1:

$$n_2 \leq n_1 < n_i$$ [General Formula 1]

wherein $n_1$ represents a refractive index of the first dielectric layer, $n_2$ represents a refractive index of the second dielectric layer, and $n_i$ represents the refractive index of the inorganic layer.

12. The barrier film according to claim 1, wherein the first dielectric layer or the second dielectric layer is an organic or organic-inorganic composite layer.

13. The barrier film according to claim 12, wherein the first dielectric layer or the second dielectric layer comprises at least one selected from the group consisting of an acrylic resin, a urethane-based resin, a melamine resin, an alkyde resin, an epoxy-based resin, a siloxane-based polymer, and an organic silane compound of Formula 1:

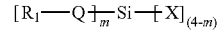

[Formula 1]

wherein X is hydrogen, a halogen, an alkoxy group, an acyloxy group, an alkylcarbonyl group, an alkoxycarbonyl group or —N(R$_2$)$_2$, in which R$_2$ is hydrogen or an alkyl group, R$_1$ is an alkyl group, an alkenyl group, an alkynyl group, an aryl group, an arylalkyl group, an alkylaryl group, an arylalkenyl group, an alkenylaryl group, an arylalkynyl group, an alkynylaryl group, a halogen, an amino group, an amide group, an aldehyde group, an alkylcarbonyl group, a carboxyl group, a mercapto group, a cyano group, a hydroxyl group, an alkoxy group, an alkoxycarbonyl group, a sulfonyl group, a phosphoryl group, an acryloyloxy group, a methacryloyloxy group or an epoxy group, Q is a single bond, an oxygen atom or —N(R$_2$)—, in which R$_2$ is a hydrogen atom or an alkyl group, and m is a number of 1 to 3.

14. The barrier film according to claim 12, wherein the first dielectric layer or the second dielectric layer comprises at least one selected from the group consisting of metal alkoxide compounds of Formula 2:

[Formula 2]

wherein M is one metal selected from the group consisting of aluminum, zirconium and titanium, R$_3$ is a halogen, an alkyl group, an alkoxy group, an acyloxy group or a hydroxyl group, and z is 3 or 4.

15. The barrier film according to claim 1, wherein the first dielectric layer or the second dielectric layer further comprises nanoparticles.

16. The barrier film according to claim 15, wherein the nanoparticles comprise a metal oxide or a metal nitride.

17. The barrier film according to claim 15, wherein the nanoparticles comprise a material selected from the group consisting of CaO, CaF$_2$, MgO, ZrO$_2$, TiO$_2$, SiO$_2$, In$_2$O$_3$, SnO$_2$, CeO$_2$, BaO, Ga$_2$O$_3$, ZnO, Sb$_2$O$_3$, NiO, and Al$_2$O$_3$.

* * * * *